(12) United States Patent
Sakamoto (10) Patent No.: US 9,579,728 B2
(45) Date of Patent: Feb. 28, 2017

(54) CUTTING TOOL

(71) Applicant: KYOCERA Corporation, Kyoto-shi, Kyoto (JP)

(72) Inventor: Yoshiki Sakamoto, Satsumasendai (JP)

(73) Assignee: Kyocera Corporation, Kyoto (JP)

(*) Notice: Subject to any disclaimer, the term of this patent is extended or adjusted under 35 U.S.C. 154(b) by 87 days.

(21) Appl. No.: 14/654,786

(22) PCT Filed: Dec. 25, 2013

(86) PCT No.: PCT/JP2013/084700
§ 371 (c)(1),
(2) Date: Jun. 22, 2015

(87) PCT Pub. No.: WO2014/104111
PCT Pub. Date: Jul. 3, 2014

(65) Prior Publication Data
US 2015/0343535 A1    Dec. 3, 2015

(30) Foreign Application Priority Data

Dec. 27, 2012 (JP) ................................. 2012-285343

(51) Int. Cl.
*B23B 27/14* (2006.01)
*C23C 14/06* (2006.01)
(Continued)

(52) U.S. Cl.
CPC .......... *B23B 27/148* (2013.01); *B23B 27/14* (2013.01); *C23C 14/0635* (2013.01);
(Continued)

(58) Field of Classification Search
USPC ........... 51/307, 309; 428/216, 697, 698, 699
See application file for complete search history.

(56) References Cited

U.S. PATENT DOCUMENTS

| 5,272,014 | A | 12/1993 | Leyendecker et al. |
| 8,945,251 | B2 | 2/2015 | Waki et al. |
| 2007/0298230 | A1 | 12/2007 | Omori et al. |
| 2008/0131219 | A1 | 6/2008 | Reineck et al. |
| 2013/0022419 | A1 | 1/2013 | Sakamoto et al. |

FOREIGN PATENT DOCUMENTS

| EP | 2868408 A1 | 5/2015 |
| JP | 1989-190383 A | 7/1989 |

(Continued)

OTHER PUBLICATIONS

International Search Report (Form PCT/ISA/210) mailed on Apr. 8, 2014 and issued for PCT/JP2013/084700.
(Continued)

*Primary Examiner* — Archene Turner
(74) *Attorney, Agent, or Firm* — Volpe and Koenig, P.C.

(57) ABSTRACT

To provide a cutting tool that includes a coating layer capable of exhibiting optimum cutting performance in each of a cutting edge, rake face, and flank face. A cutting tool (1) includes a substrate (2) that is coated with a coating layer (6) composed of $Si_aM_{1-a}(C_{1-x}N_x)$, where M represents at least one element selected from Ti, Al, Cr, W, Mo, Ta, Hf, Nb, Zr, and Y, $0.01 \leq a \leq 0.4$, and $0 \leq x \leq 1$, and that has a cutting edge (5) at an intersecting ridge line of a rake face (3) and a flank face (4). The Si content ratio in the coating layer (6) on the rake face (3) is higher than that on the cutting edge (5).

6 Claims, 3 Drawing Sheets

(51) Int. Cl.
    *C23C 30/00*        (2006.01)
    *C23C 28/04*        (2006.01)
    *C23C 28/00*        (2006.01)
(52) U.S. Cl.
    CPC ...... *C23C 14/0641* (2013.01); *C23C 14/0664* (2013.01); *C23C 28/042* (2013.01); *C23C 28/044* (2013.01); *C23C 28/42* (2013.01); *C23C 30/005* (2013.01); *B23B 2228/105* (2013.01); *B23B 2228/24* (2013.01); *B23B 2228/36* (2013.01); *Y10T 407/24* (2015.01)

(56) References Cited

FOREIGN PATENT DOCUMENTS

| | | |
|---|---|---|
| JP | 02-80559 A | 3/1990 |
| JP | 1996-267306 A | 10/1996 |
| JP | 2010-188512 A | 9/2010 |
| JP | 4975193 B2 | 4/2012 |
| JP | 5066301 B2 | 8/2012 |
| WO | 2012/043459 A1 | 4/2012 |
| WO | 2014/003131 A1 | 1/2014 |

OTHER PUBLICATIONS

Extended European Search Report, European Patent Application No. 13869341.1, Jun. 27, 2016, 7 pgs.
Korean Office Action with English concise explanation, Korean Patent Application No. 2015-7015169, Jun. 10, 2016, 6 pgs.

CUTTING TOOL

TECHNICAL FIELD

The present invention relates to a cutting tool including a substrate that is coated with a coating layer.

BACKGROUND

Currently, for cutting tools, and members, such as wear-resistant members, and sliding members, requiring high wear resistance, slidability, and fracture resistance, a technique in which a coating layer is formed on the surface of a substrate made of a sintered alloy such as a cemented carbide alloy or a cermet, a sintered body having high hardness such as diamond or cubic boron nitride (cBN), or ceramics such as alumina or silicon nitride has been employed to improve the wear resistance, slidability, or fracture resistance.

Furthermore, coating layers made of nitride mainly composed of Ti and Al and formed using an ion plating method or sputtering method have been actively studied and continuously improved for extending the tool life. In addition to the coating material elements, these surface-coated tools have been variously contrived for corresponding to changes in the cutting environment, such as an increase in cutting speed, and diversification of work materials.

For example, Patent Documents 1 and 2 disclose coating films (coating layers) of a surface-coated tool having a surface of a substrate coated by TiAlN or the like by an ion plating method, the coating films having a Ti ratio that is made larger on a cutting edge than on a flat portion by increasing an absolute value of a negative bias applied during layer formation in a later formation stage more than in an initial formation stage.

PRIOR ART DOCUMENT

Patent Document

Patent Document 1: Japanese Unexamined Patent Application No. H01-190383A
Patent Document 2: Japanese Unexamined Patent Application No. H08-267306A

SUMMARY OF THE INVENTION

Problems to be Solved by the Invention

Nevertheless, even with the configuration of the TiAlN film described in Patent Documents 1 and 2 in which the ratio of Ti is made higher on the cutting edge, chipping of the cutting edge is not sufficiently suppressed, and there are cases where wear rapidly progresses due to chipping, resulting in the inability to use the tool over an extended period of time.

The present invention has been made to solve the above problems, and an object thereof is to provide a cutting tool that includes a coating layer capable of exhibiting optimum cutting performance in each of a cutting edge, rake face, and flank face.

Means to Solve the Problem

A cutting tool of the present invention includes a substrate that is coated with a coating layer having an average composition represented by $Si_aM_{1-a}(C_{1-x}N_x)$, where M represents at least one element selected from Ti, Al, Cr, W, Mo, Ta, Hf, Nb, Zr, and Y, $0.01 \leq a \leq 0.40$, and $0 \leq x \leq 1$, and that has a cutting edge at an intersecting ridge line of a rake face and a flank face. In such a cutting tool, the Si content ratio in the coating layer on the rake face is higher than the Si content ratio in the coating layer on the cutting edge.

Effect of the Invention

According to the cutting tool of the present invention, the Si content ratio in the coating layer on the rake face is higher than the Si content ratio in the coating layer on the cutting edge, making it possible to increase the oxidation resistance of the coating layer on the rake face which increases in temperature by contact with chips. As a result, the progression of crater wear on the rake face can be suppressed. In addition, the Si content ratio on the cutting edge is relatively low compared to that on the rake face, thereby increasing the toughness of the coating layer. Accordingly, the chipping resistance of the cutting edge is improved. As a result, optimum cutting performance can be exhibited in each of the cutting edge, rake face, and flank face, making it possible to use the cutting tool over an extended period of time.

DETAILED DESCRIPTION OF THE INVENTION

Preferred embodiments of the cutting tool of the present invention will now be described with reference to FIGS. 1 and 2.

Figure 1:
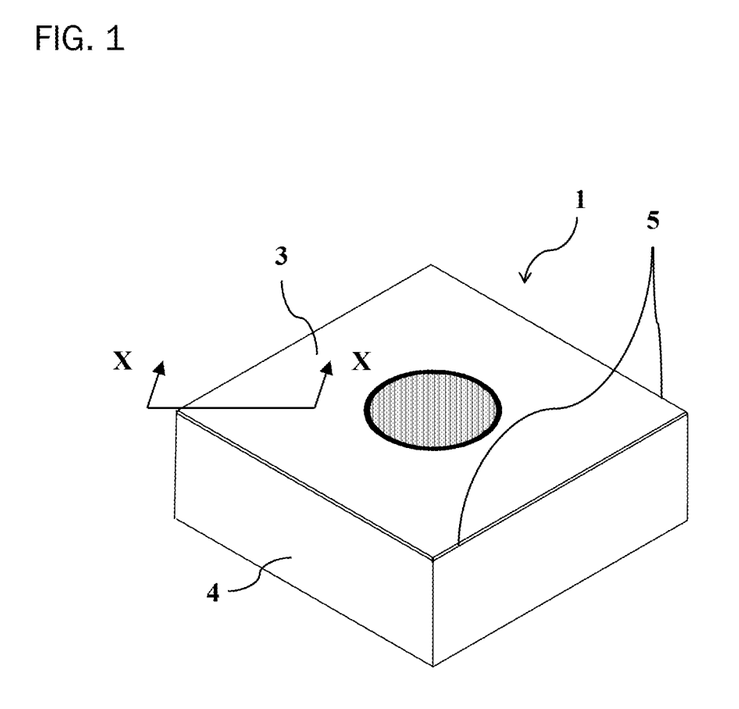
FIG. 1 is a schematic perspective view illustrating an example of the cutting tool of the present invention.
Figure 2:
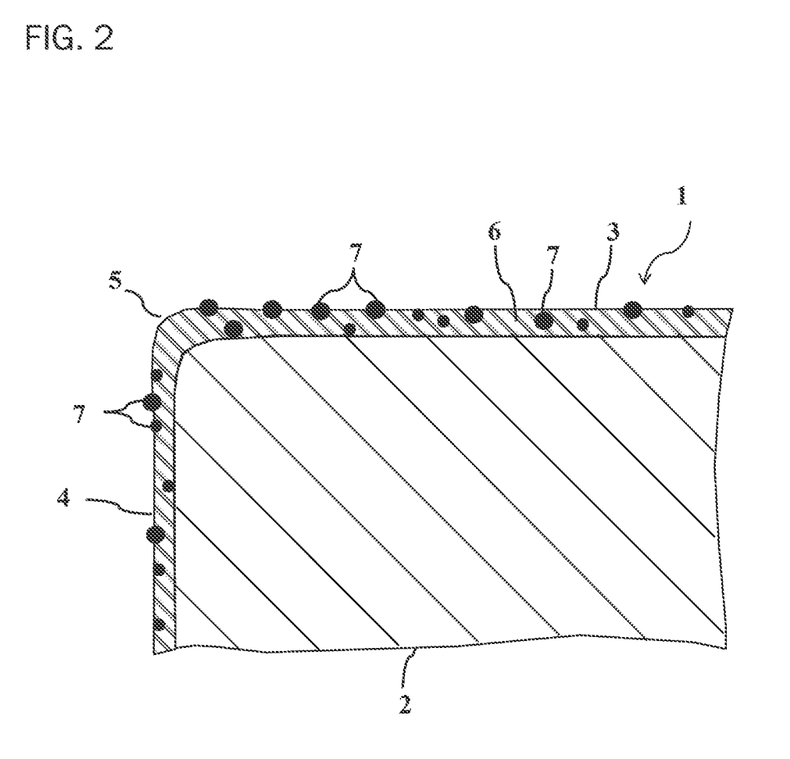
FIG. 2 is a cross-sectional view of the cutting tool taken along a line X-X of FIG. 1.

According to FIGS. 1 and 2, a cutting tool 1 includes a coating layer 6 on a surface of a substrate 2. The cutting tool 1 includes a rake face 3 on a principal surface thereof, a flank face 4 on a side surface thereof, and a cutting edge 5 at an intersecting ridge line of the rake face 3 and the flank face 4.

The coating layer 6 has an average composition represented by $Si_aM_{1-a}(C_{1-x}N_x)$, where M represents at least one element selected from Ti, Al, Cr, W, Mo, Ta, Hf, Nb, Zr, and Y, $0.01 \leq a \leq 0.40$, and $0 \leq x \leq 1$.

According to this embodiment, the Si content ratio (a) in the coating layer 6 on the rake face 3 is higher than the Si content ratio in the coating layer 6 on the cutting edge 5, more particularly, the Si content ratio in the coating layer 6 gradually increases from the cutting edge 5 toward the rake face 3. With this arrangement, it is possible to increase the oxidation resistance of the coating layer 6 on the rake face 3 which increases in temperature due to contact with chips. As a result, the progression of crater wear on the rake face 3 can be suppressed. In addition, the Si content ratio of the cutting edge 5 is relatively low compared to the rake face 3, thereby increasing the toughness of the coating layer 6. Accordingly, the chipping resistance of the cutting edge 5 is improved. As a result, the tool life is extended. It should be noted that the preferred range of the Si content ratio is from 0.01 to 0.035 in the coating layer 6 on the cutting edge 5, and from 0.01 to 0.30 in the coating layer 6 on the rake face 3.

Here, when a (the Si content ratio) is less than 0.01 in the coating layer 6 having an average composition represented by $Si_aM_{1-a}(C_{1-x}N_x)$, where M represents at least one element selected from Ti, Cr, Al, Mo, Ta, Hf, Nb, Zr, and Y, $0.01 \leq a \leq 0.4$, and $0 \leq x \leq 1$, the oxidation resistance and lubricity of the coating layer 6 decreases. When a (the Si content ratio) is greater than 0.4, the wear resistance of the coating layer 6 decreases. The particularly preferred range of a is $0.01 \leq a \leq 0.15$.

It should be noted that while M represents at least one element selected from Ti, Al, Cr, W, Mo, Ta, Hf, Nb, Zr, and Y, hardness improves when M includes at least one element among Ti, Al, Cr, Nb, Mo, and W, resulting in superior wear resistance. Of these, when M includes Ti, Al, or Nb, superior oxidation resistance at high temperatures results, making it possible to suppress the progression of crater wear in high-speed cutting, for example.

Here, examples of more specific average compositions of the coating layer 6 of this embodiment include $Si_aTi_bAl_cNb_dW_eCr_f(C_{1-x}N_x)$, where $0.01 \leq a \leq 0.40$, $0.13 \leq b \leq 0.80$, $0 \leq c \leq 0.65$, $0 \leq d \leq 0.25$, $0 \leq e \leq 0.25$, $0 \leq f \leq 0.35$, $a+b+c+d+e+f=1$, and $0 \leq x \leq 1$. With the coating layer 6 within this composition range, the oxidation start temperature of the coating layer 6 increases, making it possible to increase oxidation resistance and decrease the internal stress intrinsic to the coating layer 6, resulting in high fracture resistance. Moreover, the coating layer 6 has high hardness and high adhesiveness to the substrate 2. As a result, the coating layer 6 is superior in wear resistance and fracture resistance under harsh cutting conditions, such as machining difficult-to-machine materials, dry cutting, and high-speed cutting. It should be noted that the above composition may include at least one element selected from Mo, Ta, Hf, Zr, and Y at a content ratio in the coating layer 6 of less than 1 percent by atom.

That is, when b (the Ti content ratio) is 0.13 or greater, the crystalline structure of the coating layer 6 does not change from cubic to hexagonal, and thus there is no decrease in hardness, resulting in high wear resistance. When b (the Ti content ratio) is 0.8 or less, the oxidation resistance and thermal resistance of the coating layer 6 are high. The particularly preferred range of b is $0.15 \leq b \leq 0.50$. In addition, when c (the Al content ratio) is 0.6 or less, the crystalline structure of the coating layer 6 does not change from cubic to hexagonal, and thus there is no decrease in hardness. The particularly preferred range of c is $0.45 \leq c \leq 0.58$. Furthermore, when d (the Nb content ratio) is 0.25 or less, the oxidation resistance and hardness of the coating layer 6 do not decrease, resulting in high wear resistance. The particularly preferred range of d is $0.01 \leq d \leq 0.20$. When e (the W content ratio) is 0.25 or less, the oxidation resistance and hardness of the coating layer 6 do not decrease, resulting in high wear resistance. The particularly preferred range of e is $0.01 \leq e \leq 0.20$. When f (the Cr content ratio) is 0.35 or less, the welding resistance of the coating layer 6 is high and there is no decrease in oxidation resistance, resulting in high wear resistance. The particularly preferred range of f is $0.01 \leq f \leq 0.30$.

In addition, the nonmetal components of the coating layer 6, C and N, affect the hardness and toughness necessary to a cutting tool and, according to this embodiment, x (the N content ratio) is $0 \leq x \leq 1$, more particularly $0.8 \leq x \leq 1$.

The average composition of the coating layer 6 described above can be identified by measuring the composition from the surface of the coating layer 6 to the substrate side using energy dispersive X-ray spectroscopy (EDS) or X-ray photoelectron spectroscopy (XPS). The average compositions of the coating layer 6 on the cutting edge 5, the rake face 3, and the flank face 4 can each be found by measuring the compositions of the coating layers on the cutting edge 5, rake face 3, and flank face 4.

In addition, in this embodiment, the Si content ratio in the coating layer 6 on the cutting edge 5 is higher than the Si content ratio in the coating layer 6 on the flank face 4, and the Si content ratio in the coating layer 6 gradually increases from the flank face 4 toward the cutting edge 5. With this arrangement, it is possible to improve the thermal resistance of the cutting edge 5, and the fracture resistance of the flank face 4 increases.

In addition, according to this embodiment, the Si content ratio in the average composition of the coating layer 6 on the rake face 3 is higher than the Si content ratio in the average composition of the coating layer 6 on the flank face 4. With this arrangement, the hardness and oxidation resistance of the rake face 3 are improved, making it possible to suppress crater wear on the rake face 3. Furthermore, the toughness of the flank face 4 increases, making it possible to suppress boundary damage on the flank face.

It should be noted that the range of the cutting edge 5 when the composition and thickness of the coating layer 6 described below are specified is defined as a region having a width of 500 μm from the intersecting ridge line of the rake face 3 and the flank face 4. Accordingly, the range of the rake face 3 is the region extending from the center of the rake face 3 on the principal surface or the like of the cutting tool 1 to the position 500 μm from the intersecting ridge line, which is the end edge of the cutting edge 5, and the range of the flank face 4 is the region extending from the center of the flank face 4 on the side surface or the like of the cutting tool 1 to the position 500 μm from the intersecting ridge line, which is the end edge of the cutting edge 5.

Here, in this embodiment, the average composition of the coating layer 6 on the cutting edge 5 in the above-described composition formula $Si_aTi_bAl_cNb_dW_eCr_f(C_{1-x}N_x)$ is $0.012 \leq a \leq 0.35$, $0.15 \leq b \leq 0.80$, $0 \leq c \leq 0.63$, $0 \leq d \leq 0.25$, $0 \leq e \leq 0.25$, $0 \leq f \leq 0.35$, $a+b+c+d+e+f=1$, and $0 \leq x \leq 1$. The composition of the coating layer 6 on the rake face 3 in the above-described composition formula $Si_aTi_bAl_cNb_dW_eCr_f(C_{1-x}N_x)$ is $0.015 \leq a \leq 0.4$, $0.13 \leq b \leq 0.78$, $0 \leq c \leq 0.65$, $0 \leq d \leq 0.25$, $0 \leq e \leq 0.25$, $0 \leq f \leq 0.35$, $a+b+c+d+e+f=1$, and $0 \leq x \leq 1$. The composition of the coating layer 6 on the flank face 4 in the above-described composition formula $Si_aTi_bAl_cNb_dW_eCr_f(C_{1-x}N_x)$ is $0.01 \leq a \leq 0.3$, $0.14 \leq b \leq 0.79$, $0 \leq c \leq 0.62$, $0 \leq d \leq 0.25$, $0 \leq e \leq 0.25$, $0 \leq f \leq 0.35$, $a+b+c+d+e+f=1$, and $0 \leq x \leq 1$.

Figure 3:
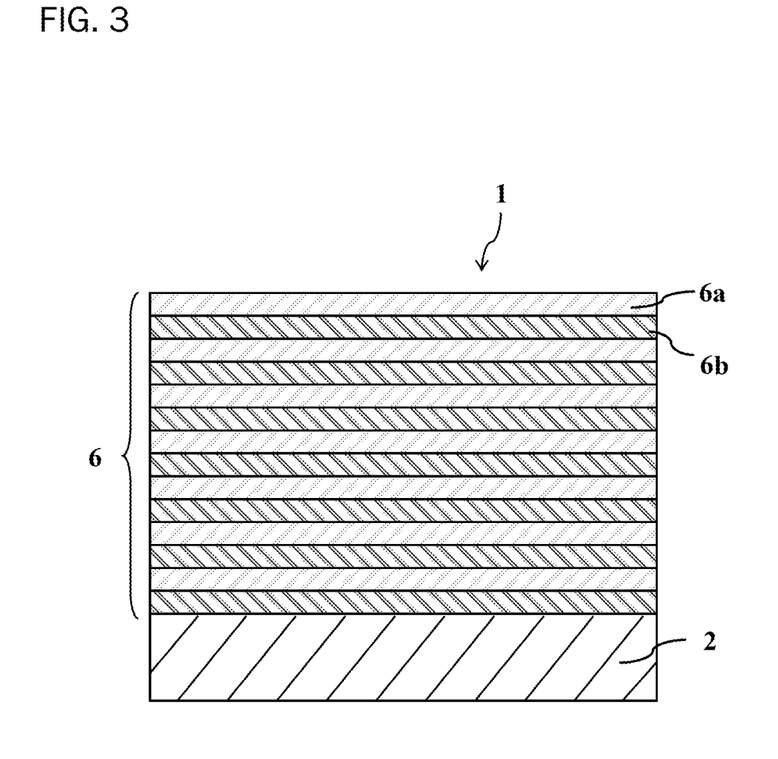
FIG. 3 is an enlarged view illustrating the main portion of an example of the coating layer of the cutting tool of FIGS. 1 and 2.

In addition, while the entire coating layer 6 may be composed of a uniform single composition, the coating layer 6 in this embodiment is a multilayer structure in which at least two layers having different compositions are alternately layered, as illustrated in the enlarged view of the main portion of the example of the coating layer 6 in FIG. 3. Then, in this embodiment, the coating layer 6 is composed of a structure in which a first layer 6a and a second layer 6b are repeatedly alternately layered, and the total number of layers is at least 10. With this arrangement, it is possible to suppress the progression of a crack inside the coating layer 6, and the entire coating layer 6 increases in hardness, thereby improving wear resistance. Furthermore, the internal stress of the coating layer 6 can be reduced, making it possible to suppress the chipping and peeling of the coating layer 6, even if the coating layer 6 is made thick.

It should be noted that, in this invention, in the case of the coating layer 6 thus being composed of a multilayer structure having at least two different compositions, the average composition of the coating layer 6 is expressed by the overall composition from the surface of the coating layer 6 to the substrate using the aforementioned EDS or XPS analysis. Then, the cross-section of the coating layer 6 can be observed using a transmission electron microscope (TEM), and the respective compositions of the first layer 6a and the second layer 6b in the coating layer 6 can be measured by EDS analysis.

In addition, in order to form the coating layer 6 of the above-described multilayer structure, targets having different compositions are placed at regular intervals on the inner wall side surface of a chamber of a deposition apparatus, and film deposition is conducted while rotating the samples to be deposited.

In a case in which one layer (the first layer 6a or the second layer 6b) is composed of $Si_aTi_bAl_cNb_dW_e(C_{1-x1}N_{x1})$, where $0.01 \leq a \leq 0.80$, $0.1 \leq b \leq 0.80$, $0 \leq c \leq 0.80$, $0 \leq d \leq 0.50$, $0 \leq e \leq 0.50$, $a+b+c+d+e=1$, and $0 \leq x1 \leq 1$, and the other layer (the first layer 16a or the second layer 6b) is composed of $Si_gAl_hCr_i(C_{1-x2}N_{x2})$, where $0 \leq g \leq 0.30$, $0.30 \leq h \leq 0.90$, $0.05 \leq i \leq 0.70$, $0 \leq x2 \leq 1$, the hardness and welding resistance of the coating layer 6 improve and the internal stress of the coating layer 6 can be decreased, making it possible to suppress the chipping and peeling of the coating layer 6 even if the coating layer 6 is made thick. The more preferable range of each element is $0.01 \leq a \leq 0.20$, $0.10 \leq b \leq 0.50$, $0.30 \leq c \leq 0.70$, $0.01 \leq d \leq 0.30$, $0.01 \leq e \leq 0.20$, $0 \leq g \leq 0.20$, $0.30 \leq h \leq 0.80$, $0.15 \leq i \leq 0.60$, $0.8 \leq x1 \leq 1$, and $0.8 \leq x2 \leq 1$.

Here, the compositions of the first layer 6a and the second layer 6b are calculated by measuring the compositions of five consecutive layers at a time (10 layers total) and taking the average thereof.

In the above composition formula of the coating layer 6, the composition of one coating layer (the first layer 6a or the second layer 6b) on the cutting edge 5 is $0.01 \leq a \leq 0.75$, $0.15 \leq b \leq 0.80$, $0 \leq c \leq 0.70$, $0 \leq d \leq 0.50$, $0 \leq e \leq 0.50$, $a+b+c+d+e=1$, and $0 \leq x1 \leq 1$. The composition of one of the coating layers on the rake face 3 is $0.02 \leq a \leq 0.80$, $0.10 \leq b \leq 0.70$, $0 \leq c \leq 0.80$, $0 \leq d \leq 0.50$, $0 \leq e \leq 0.50$, $a+b+c+d+e=1$, and $0 \leq x1 \leq 1$. The composition of one of the coating layers on the flank face 4 is $0.01 \leq a \leq 0.70$, $0.1 \leq b \leq 0.75$, $0 \leq c \leq 0.75$, $0 \leq d \leq 0.50$, $0 \leq e \leq 0.50$, $a+b+c+d+e=1$, and $0 \leq x1 \leq 1$.

In addition, the composition of the other coating layer (the first layer 6a or the second layer 6b) on the cutting edge 5 is $0 \leq g \leq 0.25$, $0.30 \leq h \leq 0.75$, $0.05 \leq i \leq 0.60$, and $0 \leq x2 \leq 1$. The composition of the second layer 6b on the rake face 3 is $0 \leq g \leq 0.30$, $0.40 \leq h \leq 0.80$, $0.05 \leq i \leq 0.70$, and $0 \leq x2 \leq 1$. The composition of the second layer 6b on the flank face 4 is $0 \leq g \leq 0.20$, $0.30 \leq h \leq 0.60$, $0.05 \leq i \leq 0.65$, and $0 \leq x2 \leq 1$.

Furthermore, according to this embodiment, a ratio (tc/tr) of a thickness tc of the coating layer 6 on the cutting edge 5 to a thickness tr of the coating layer 6 on the rake face 3 is from 1.1 to 3. With this arrangement, it is possible to maintain a balance between the chipping resistance of the cutting edge 5 and the wear resistance of the rake face 3, thereby lengthening the tool life.

It should be noted that a thickness tf of the coating layer 6 on the flank face 4 is greater than the thickness tr on the rake face 3. With this arrangement, the wear resistance of the flank face 4 improves, making it possible to extend the tool life. According to this embodiment, a ratio (tf/tr) of the thickness tf of the coating layer 6 on the flank face 4 to the thickness tr of the coating layer 6 on the rake face 3 is from 1.2 to 3.

In addition, granular substances called droplets 7 exist on the surface and in the interior of the coating layer 6, as illustrated in FIG. 2. Then, according to this embodiment, the average composition of the droplets 7 that exist on the surface of the rake face 3 has a content ratio of Si that is higher than the average composition of the droplets 7 that exist on the surface of the flank face 4.

According to this configuration, even if chips pass on the rake face 3 during cutting, the presence of the droplets 7 prevents the chips from coming into flat contact with the rake face 3, and the temperature of the surface of the coating layer 6 is not increased too much. Moreover, since the Si content ratio of the droplets 7 is higher on the rake face 3 than on the flank face 4, the thermal resistance of the droplets 7 that exist on the rake face 3 is high and an effect of holding cutting fluid on the surface of the coating layer 6 is exhibited. In addition, since the Si content ratio of the droplets 7 on the flank face 4 is low and the thermal resistance is low, the droplets 7 easily wear, thereby improving the machined surface conditions during machining.

It should be noted that, according to this embodiment, the Si content ratio $Si_{DR}$ of the droplets 7 formed on the surface of the rake face 3 of the coating layer 6 to the Si content ratio $Si_{DF}$ of the droplets 7 formed on the surface of the flank face 4 is $1.05 \leq Si_{DR}/Si_{DF} \leq 3.50$. With this arrangement, it is possible to optimize the wear resistance of both the rake face 3 and the flank face 4.

In addition, the number of existing droplets 7 having a diameter of at least 0.2 μm is 15 to 50 in a 10 μm square area of the rake face 3, preferably 18 to 30, from the viewpoint of relieving the heat due to passage of chips. Furthermore, the number of droplets 7 on the rake face 3 is preferably greater than the number of droplets 7 that exist on the flank face 4 from the viewpoint of suppressing the rake face 3 from being highly heated due to passage of chips and also smoothening the surface of the flank face 4 to improve the machined surface quality.

Furthermore, the Al content ratio $Al_{DR}$ of the droplets 7 formed on the surface of the rake face 3 of the coating layer 6 to the Al content ratio $Al_{DF}$ of the droplets formed on the surface of the flank face 4 is preferably $1.00 \leq Al_{DR}/AL_{DF} \leq 1.10$ from the viewpoint of optimizing the wear resistance of the rake face 3 and flank face 4. A particularly preferred range of the ratio $Al_{DR}/Al_{DF}$ is $1.00 \leq Al_{DR}/Al_{DF} \leq 1.02$. Furthermore, the Ti content ratio $Ti_{DR}$ of the droplets 7 formed on the surface of the rake face 3 of the coating layer 6 to the Ti content ratio $Ti_{DF}$ of the droplets 7 formed on the surface of the flank face 4 is preferably $0.91 \leq Ti_{DR}/Ti_{DF} \leq 0.97$ from the viewpoint of optimizing the chipping resistance of both the rake face 3 and the flank face 4. A particularly preferred range of the ratio $Ti_{DR}/Ti_{DF}$ is $0.94 \leq Ti_{DR}/Ti_{DF} \leq 0.97$.

It should be noted that preferred examples of the substrate 2 is composed of a hard material including: a hard metal such as a cemented carbide alloy or cermet which is composed of a hard phase mainly containing tungsten carbide and titanium carbonitride and a binding phase mainly containing an iron group metal such as cobalt and nickel; ceramics mainly containing silicon nitride and aluminum oxide; an ultrahigh pressure sintered body which is made by sintering a hard phase composed of polycrystalline diamond and cubic boron nitride and a binding phase such as ceramics and iron group metal under ultrahigh pressure.

(Manufacturing Method)

Next, the manufacturing method of the cutting tool of the present invention will be described.

First, a substrate having a shape of a tool is made by using a conventionally well-known method. Next, a coating layer is formed on the surface of the substrate. The coating layer can be preferably formed by a physical vapor deposition (PVD) method such as an ion plating method or sputtering method. An example of a method for forming a coating layer will be described in detail hereafter. In the case where a coating layer is formed by arc ion plating method, a metal target, a composite alloy target, or a sintered body target individually containing metal silicon (Si) and a predetermined metal M, where M represents at least one element selected from Ti, Al, Cr, W, Mo, Ta, Hf, Nb, Zr and Y, is set in a side wall surface position of a chamber. According to this embodiment, two types of targets are used to form the coating, namely a first target having a high Si content, and a second target that does not contain Si or has a low Si content.

At this time, a center magnet is arranged around the target so as to be positioned in the center of the back surface of the target. According to the present invention, the strength of the magnetic force of this magnet is controlled, making it possible to make the cutting tool of the above embodiment. That is, the magnetic force of the center magnet attached to the first target is made stronger, and the magnetic force of the center magnet of the second target is made weaker. With this arrangement, the state of diffusion of the metal ions generated from each target is changed, thereby changing the state of distribution of the metal ions that exist inside the chamber. As a result, it is possible to change the ratio of each metal in the coating layer formed on the surface of the substrate as well as the state of existence of the droplets.

The coating layer is formed by an ion plating method or sputtering method using these targets by evaporating the metal sources with arc discharge, glow discharge, or the like for ionization and, at the same time, reacting the ionized metals with a nitrogen ($N_2$) gas from a nitrogen source, and a methane ($CH_4$)/acetylene ($C_2H_2$) gas from a carbon source. Here, the substrate is placed so that the flank face is substantially parallel to the side surface of the chamber and the rake face is substantially parallel to the top surface of the chamber. At this time, while a magnetic force of 2 to 8 T is applied to the center magnet to form a coating, the magnetic force applied to the center magnet attached to the first target is made stronger than the magnetic force applied to the center magnet attached to the second target.

It should be noted that, when the coating layer described above is formed, according to this embodiment, a bias voltage of 35 to 200 V is applied in order to form a coating layer with high hardness and to increase the adhesiveness of the coating layer to the substrate in consideration of the crystalline structure of the coating layer.

In addition, since the sample set inside the chamber is coated while being rotated inside the chamber, causing the distance between the sample and the two types of targets to cyclically vary, it is possible to form a coating layer having an alternating layer structure of a first layer and a second layer.

WORKING EXAMPLE 1

A tungsten carbide (WC) powder having an average particle diameter of 0.8 μm as a main component was mixed with 10% by mass of metal cobalt (Co) powder having an average particle diameter of 1.2 μm, 0.1% by mass of vanadium carbide (VC) powder having an average particle diameter of 1.0 μm, and 0.3% by mass of chromium carbide ($Cr_3C_2$) powder having an average particle diameter of 1.0 μm. The mixture was then press-molded into a throw-away tip of the shape of the cutting tool BDMT11T308TR-JT manufactured by KYOCERA Corporation, followed by debinding and firing in a vacuum of 0.01 Pa at 1450° C. for one hour to make a cemented carbide alloy. In addition, the rake face surface of each sample was polished by using a method such as blasting or brushing. Furthermore, the resulting cemented carbide alloy was subjected to cutting edge treatment (honing) by brushing.

Coating layers having the compositions shown in Tables 2 and 3 were formed at a film-forming temperature of 540° C. by applying a bias voltage shown in Table 1 to the substrate made as in the above and allowing 150 A arc current to flow to a first target and a second target inside the chamber, with center magnets of magnetic forces shown in Table 1 set on the first target and the second target. It should be noted that the overall composition of the coating layer was measured using the method described below.

For each throw-away tip obtained, three random positions of the cutting edge, the rake face, and the flank face on the surface of the coating layer and the droplets formed on the surface of the rake face and flank face were observed by using a scanning electron microscope (SEM), and the composition at each position was analyzed. The average compositions of the three positions of the cutting edge, rake face, and flank face were expressed as the compositions of the coating layer on the cutting edge, rake face, and flank face. In addition, the number of droplets having a diameter of 0.2 μm or greater in any one visual field of 10 μm×10 μm was measured, and the average number of droplets in five measurement locations was calculated. Furthermore, the respective compositions of ten droplets were measured by energy dispersive X-ray spectrometry (EDS) (EDAX manufactured by AMETEK Co., Ltd), and the average thereof was calculated as the composition of the droplets on the rake face, flank face, and each surface of the coating layer. In the Table, $Si_{DR}$, $Ti_{DR}$, and $Al_{DR}$ respectively denote the average contents (% by atom) of Si, Ti, and Al in the droplets formed on the rake face, and $Si_{DF}$, $Ti_{DF}$, and $Al_{DF}$ respectively denote the average contents (% by atom) of Si, Ti, and Al in the droplets formed on the flank face. Furthermore, the thickness ratio of the coating layer were found by observing a cross-section that includes a coating layer of each sample by SEM, and then measuring the thickness of the coating layer at each of the cutting edge, rake face, and flank face positions. The results are shown in Tables 2 to 4.

TABLE 1

| | First Target | | | Second Target | | | |
| --- | --- | --- | --- | --- | --- | --- | --- |
| Sample No | Composition | Magnetic Force (T) | Current (A) | Composition | Magnetic Force (T) | Current (A) | Bias Voltage (V) |
| 1 | TiAlWNbCr | 3T | 150 | AlSi | 5T | 150 | 75 |
| 2 | TiAlW | 3T | 150 | AlSi | 5T | 150 | 75 |
| 3 | TiNb | 3T | 150 | Si | 6T | 150 | 150 |
| 4 | TiAlNb | 2T | 150 | AlSiNb | 4T | 150 | 75 |
| 5 | TiAlY | 2T | 150 | SiW | 5T | 150 | 100 |
| 6 | TiAlNb | 4T | 150 | AlCrSi | 8T | 150 | 75 |

TABLE 1-continued

| | First Target | | | Second Target | | | |
|---|---|---|---|---|---|---|---|
| Sample No | Composition | Magnetic Force (T) | Current (A) | Composition | Magnetic Force (T) | Current (A) | Bias Voltage (V) |
| 7 | TiAlNb | 2T | 150 | Si | 5T | 150 | 150 |
| 8 | TiAlWCrNb | 8T | 150 | Si | 5T | 150 | 75 |
| 9 | TiAlCrSi | 5T | 150 | Si | 5T | 150 | 100 |

TABLE 2

| | Coating Layer | | Coating Layer | |
|---|---|---|---|---|
| Sample No | Cutting Edge Composition | Thickness tc (μm) | Rake Face Composition | Thickness tr (μm) |
| 1 | $Si_{0.27}Ti_{0.17}Al_{0.53}W_{0.01}Nb_{0.01}Cr_{0.01}N$ | 4.8 | $Si_{0.29}Ti_{0.15}Al_{0.53}W_{0.01}Nb_{0.01}Cr_{0.01}N$ | 3.2 |
| 2 | $Si_{0.26}Ti_{0.20}Al_{0.51}W_{0.03}N$ | 3.6 | $Si_{0.28}Ti_{0.18}Al_{0.52}W_{0.02}N$ | 2.5 |
| 3 | $Si_{0.18}Ti_{0.72}Nb_{0.10}C_{0.2}N_{0.8}$ | 5.1 | $Si_{0.2}Ti_{0.69}Nb_{0.11}C_{0.2}N_{0.8}$ | 3.9 |
| 4 | $Si_{0.04}Ti_{0.31}Al_{0.61}Nb_{0.04}N$ | 4.8 | $Si_{0.05}Ti_{0.29}Al_{0.62}Nb_{0.04}N$ | 3.5 |
| 5 | $Si_{0.06}Ti_{0.46}Al_{0.47}Y_{0.01}N$ | 3.5 | $Si_{0.07}Ti_{0.44}Al_{0.48}Y_{0.01}N$ | 2.9 |
| 6 | $Si_{0.05}Ti_{0.39}Al_{0.51}Cr_{0.05}N$ | 4.6 | $Si_{0.06}Ti_{0.38}Al_{0.52}Cr_{0.04}N$ | 3.3 |
| 7 | $Si_{0.06}Ti_{0.44}Al_{0.46}Nb_{0.04}N$ | 4.1 | $Si_{0.07}Ti_{0.45}Al_{0.45}Nb_{0.03}N$ | 3.3 |
| 8 | $Si_{0.10}Ti_{0.28}Al_{0.46}Nb_{0.05}Cr_{0.10}W_{0.01}N$ | 3.1 | $Si_{0.09}Ti_{0.3}Al_{0.45}Nb_{0.05}Cr_{0.10}W_{0.01}N$ | 2.7 |
| 9 | $Si_{0.05}Ti_{0.39}Al_{0.53}Cr_{0.03}N$ | 3.8 | $Si_{0.05}Ti_{0.40}Al_{0.50}Cr_{0.05}N$ | 3.2 |

TABLE 3

| | Coating Layer | | | |
|---|---|---|---|---|
| Sample No | Flank Face Composition | Thickness tr (μm) | tc/tr | tf/tr |
| 1 | $Si_{0.25}Ti_{0.2}Al_{0.52}W_{0.01}Nb_{0.01}Cr_{0.01}N$ | 4.1 | 1.50 | 1.28 |
| 2 | $Si_{0.25}Ti_{0.23}Al_{0.50}W_{0.02}N$ | 3 | 1.44 | 1.20 |
| 3 | $Si_{0.15}Ti_{0.75}Nb_{0.10}C_{0.2}N_{0.8}$ | 4.5 | 1.31 | 1.15 |
| 4 | $Si_{0.03}Ti_{0.35}Al_{0.60}Nb_{0.02}N$ | 4 | 1.37 | 1.14 |
| 5 | $Si_{0.05}Ti_{0.45}Al_{0.49}Y_{0.01}N$ | 3.5 | 1.21 | 1.21 |
| 6 | $Si_{0.05}Ti_{0.4}Al_{0.5}Cr_{0.05}N$ | 4 | 1.39 | 1.21 |
| 7 | $Si_{0.05}Ti_{0.45}Al_{0.45}Nb_{0.05}N$ | 3.8 | 1.24 | 1.15 |
| 8 | $Si_{0.11}Ti_{0.24}Al_{0.49}Nb_{0.06}Cr_{0.09}W_{0.01}N$ | 2.7 | 1.00 | 0.87 |
| 9 | $Si_{0.06}Ti_{0.39}Al_{0.52}Cr_{0.03}N$ | 3.2 | 1.09 | 0.91 |

Next, a cutting test was performed by using the obtained throw-away tips under the cutting conditions described below. The results are shown in Table 4.

Cutting method: Milling

Workpiece: Die steel (SKD11)

Cutting speed: 150 m/min

Feeding: 0.12 mm/rev

Cutting depth: 2.0 mm

Cutting state: Dry

Evaluation method: The cutting tool after the machining of 200 workpieces was observed to check the condition of the cutting edge. In addition, the number of workpieces machined until the end of the life of the tool was checked.

TABLE 4

| | Rake Face Droplets | | | | Flank Face Droplets | | | | Content Ratio | | | Cutting Result | |
|---|---|---|---|---|---|---|---|---|---|---|---|---|---|
| Sample No | Quantity (droplets) | $Si_{DR}$ | $Ti_{DR}$ | $Al_{DR}$ | Quantity (droplets) | $Si_{DF}$ | $Ti_{DF}$ | $Al_{DF}$ | $Si_{DR}/Si_{DF}$ | $Ti_{DR}/Ti_{DF}$ | $Al_{DR}/Al_{DF}$ | Number of Workpieces (pieces) | Condition of Cutting Edge |
| 1 | 30.0 | 29.9 | 17.0 | 54.6 | 20.0 | 24.3 | 17.4 | 50.4 | 1.23 | 0.97 | 1.08 | 740 | Steady wear |
| 2 | 17.2 | 28.8 | 19.4 | 53.6 | 15.1 | 24.3 | 21.2 | 48.5 | 1.19 | 0.92 | 1.10 | 500 | Slightly chipped |
| 3 | 22.4 | 20.2 | 72.5 | — | 19.8 | 14.9 | 71.3 | — | 1.36 | 1.02 | — | 470 | Chipped |
| 4 | 27.8 | 4.9 | 31.0 | 61.4 | 23.3 | 3.1 | 32.6 | 60.0 | 1.57 | 0.95 | 1.02 | 720 | Steady wear |
| 5 | 25.5 | 7.2 | 44.0 | 48.5 | 24.5 | 4.9 | 45.0 | 48.5 | 1.49 | 0.98 | 1.00 | 630 | Steady wear |
| 6 | 43.4 | 6.2 | 38.4 | 52.5 | 36.7 | 4.9 | 39.6 | 51.5 | 1.27 | 0.97 | 1.02 | 680 | Steady wear |
| 7 | 24.6 | 7.2 | 45.5 | 45.5 | 22.2 | 4.9 | 44.6 | 44.6 | 1.49 | 1.02 | 1.02 | 570 | Slightly chipped |
| 8 | 26.9 | 8.7 | 30.3 | 44.4 | 32.2 | 10.7 | 28.5 | 42.7 | 0.82 | 1.06 | 1.04 | 300 | Chipped in early stage and heavy wear |

TABLE 4-continued

| | Rake Face Droplets | | | | Flank Face Droplets | | | | Content Ratio | | | Cutting Result | |
| --- | --- | --- | --- | --- | --- | --- | --- | --- | --- | --- | --- | --- | --- |
| Sample No | Quantity (droplets) | $Si_{DR}$ | $Ti_{DR}$ | $Al_{DR}$ | Quantity (droplets) | $Si_{DF}$ | $Ti_{DF}$ | $Al_{DF}$ | $Si_{DR}/Si_{DF}$ | $Ti_{DR}/Ti_{DF}$ | $Al_{DR}/Al_{DF}$ | Number of Workpieces (pieces) | Condition of Cutting Edge |
| 9 | 44.3 | 4.9 | 40.4 | 50.5 | 24.3 | 5.8 | 36.8 | 48.5 | 0.83 | 1.10 | 1.04 | 400 | Chipped in early stage and heavy wear |

The results shown in Tables 1 to 4 demonstrate that in sample No. 9, which had the same Si content ratio in the coating layer on the cutting edge and rake face, and sample No. 8, which had a lower Si content ratio in the coating layer on the rake face than the cutting edge, chipping readily occurred on the cutting edge and crater wear progressed on the rake face, resulting in a short tool life.

In contrast, sample Nos. 1 to 7, which are within the scope of the present invention, all have little chipping on the cutting edge and slow progression of crater wear on the rake face, exhibiting favorable cutting performance.

WORKING EXAMPLE 2

Coating layers having the compositions shown in Tables 6 to 8 were formed at a film-forming temperature of 540° C. by applying a bias voltage shown in Table 5 to the substrate of working example 1 and allowing 150 A arc current to flow to the first target and the second target, with center magnets of magnetic forces shown in Table 5 set on the first target and the second target. It should be noted that the overall compositions of the coating layers were measured in the same manner as in working example 1.

In addition, for each sample obtained, the number of droplets on the surface of the coating layer on the cutting edge, rake face, and flank face, the average contents (% by atom) of Si, Al, and Ti in the droplets, and the thickness of the coating layer at each position were measured in the same manner as in working example 1. The results are shown in Tables 6 and 7.

It should be noted that observations of each coating layer using a transmission electron microscope (TEM) found that the coating layer is composed of a structure in which the first layer and second layer are alternately layered. The thicknesses of the first layer and the second layer in 10 consecutive layers (five layers each of the first layer and the second layer) were measured and the average thereof was calculated, revealing an average thickness of 10 nm for all. In addition, the compositions of the first layer and the second layer were analyzed with respect to the five consecutive layers at a time using energy dispersive X-ray spectrometry (EDS) attached to a TEM device. The results are shown in Tables 6 to 9. Furthermore, the cutting performance was evaluated under the same conditions as in working example 1. The results are shown in Table 10.

TABLE 5

| | First Target | | | Second Target | | | |
| --- | --- | --- | --- | --- | --- | --- | --- |
| Sample No | Composition | Magnetic Force (T) | Current (A) | Composition | Magnetic Force (T) | Current (A) | Bias Voltage (V) |
| 10 | AlCr | 3T | 130 | TiAlWNbSi | 5T | 160 | 75 |
| 11 | TiAlNbSi | 5T | 150 | AlCrSi | 5T | 140 | 75 |
| 12 | TiAlNb | 3T | 150 | SiTi | 5T | 150 | 75 |

TABLE 6

Coating Layer (Cutting Edge)

| Sample No | Overall Composition | First Layer | Second Layer | Thickness tc (μm) |
| --- | --- | --- | --- | --- |
| 10 | $Si_{0.02}Ti_{0.23}Al_{0.56}W_{0.01}Nb_{0.02}Cr_{0.16}N$ | $Al_{0.68}Cr_{0.32}N$ | $Si_{0.04}Ti_{0.46}Al_{0.44}W_{0.02}Nb_{0.04}N$ | 5.1 |
| 11 | $Si_{0.17}Ti_{0.19}Al_{0.50}Nb_{0.05}Cr_{0.09}N$ | $Si_{0.15}Ti_{0.38}Al_{0.37}Nb_{0.10}N$ | $Si_{0.19}Al_{0.63}Cr_{0.18}N$ | 4.4 |
| 12 | $Si_{0.40}Ti_{0.30}Al_{0.25}Nb_{0.05}N$ | $Ti_{0.40}Al_{0.50}Nb_{0.10}N$ | $Si_{0.80}Ti_{0.20}N$ | 4.6 |

TABLE 7

Coating Layer (Rake Face)

| Sample No | Overall Composition | First Layer | Second Layer | Thickness tr (μm) |
| --- | --- | --- | --- | --- |
| 10 | $Si_{0.03}Ti_{0.22}Al_{0.53}W_{0.02}Nb_{0.01}Cr_{0.19}N$ | $Al_{0.62}Cr_{0.38}N$ | $Si_{0.06}Ti_{0.44}Al_{0.44}W_{0.04}Nb_{0.02}N$ | 3.2 |
| 11 | $Si_{0.19}Ti_{0.18}Al_{0.49}Nb_{0.04}Cr_{0.10}N$ | $Si_{0.17}Ti_{0.36}Al_{0.39}Nb_{0.08}N$ | $Si_{0.21}Al_{0.59}Cr_{0.20}N$ | 2.8 |
| 12 | $Si_{0.43}Ti_{0.28}Al_{0.22}Nb_{0.07}N$ | $Ti_{0.56}Al_{0.30}Nb_{0.14}N$ | $Si_{0.86}Ti_{0.14}N$ | 3.1 |

TABLE 8

| Sample No | Overall Composition | Coating Layer (Flank Face) First Layer | Second Layer | Thickness tf (μm) |
|---|---|---|---|---|
| 10 | $Si_{0.01}Ti_{0.23}Al_{0.59}W_{0.01}Nb_{0.01}Cr_{0.15}N$ | $Al_{0.70}Cr_{0.30}N$ | $Si_{0.02}Ti_{0.46}Al_{0.48}W_{0.02}Nb_{0.02}N$ | 4.1 |
| 11 | $Si_{0.15}Ti_{0.18}Al_{0.51}Nb_{0.06}Cr_{0.10}N$ | $Si_{0.13}Ti_{0.36}Al_{0.39}Nb_{0.12}N$ | $Si_{0.17}Al_{0.63}Cr_{0.20}N$ | 3.8 |
| 12 | $Si_{0.38}Ti_{0.32}Al_{0.25}Nb_{0.05}N$ | $Ti_{0.40}Al_{0.50}Nb_{0.10}N$ | $Si_{0.76}Ti_{0.24}N$ | 3.9 |

TABLE 9

| Sample No | Tc/Tr | tf/tr | Rake Face Droplets Quantity (droplets) | $Si_{DR}$ | $Ti_{DR}$ | $Al_{DR}$ | Flank Face Droplets Quantity (droplets) | $Si_{DF}$ | $Ti_{DF}$ | $Al_{DF}$ | Content Ratio $Si_{DR}/Si_{DF}$ | $Ti_{DR}/Ti_{DF}$ | $Al_{DR}/Al_{DF}$ |
|---|---|---|---|---|---|---|---|---|---|---|---|---|---|
| 10 | 1.59 | 1.28 | 28.0 | 3.1 | 21.1 | 54.6 | 23.5 | 1.0 | 22.3 | 54.3 | 3.19 | 0.95 | 1.01 |
| 11 | 1.57 | 1.36 | 33.0 | 19.6 | 18.0 | 50.5 | 28.0 | 14.6 | 18.5 | 48.5 | 1.35 | 0.97 | 1.04 |
| 12 | 1.48 | 1.26 | 19.5 | 44.3 | 28.8 | 22.7 | 18.0 | 36.9 | 31.0 | 22.8 | 1.20 | 0.93 | 1.00 |

TABLE 10

| Sample No | Cutting Performance Number of Workpieces (pieces) | Condition of Cutting Edge |
|---|---|---|
| 10 | 1120 | Steady wear |
| 11 | 1050 | Steady wear |
| 12 | 830 | Steady wear |

The results shown in Tables 5 to 10 demonstrate that in each of sample Nos. 10 to 12, little chipping occurred on the cutting edge and progression of crater wear on the rake face was slow, resulting in a large number of workpieces machined. In particular, sample Nos. 10 and 11 including the coating layer in which one of the first layer and the second layer composed of $Si_aTi_bAl_cNb_dW_e(C_{1-x1}N_{x1})$, where 0.01≤a≤0.80, 0.1≤b≤0.80, 0≤c≤0.80, 0≤d≤0.50, 0≤e≤0.50, a+b+c+d+e=1, and 0≤x1≤1, and the other of the second layer and the first layer composed of $Si_gAl_hCr_i(C_{1-x2}N_{x2})$, where 0≤g≤0.30, 0.30≤h≤0.90, 0.05≤i≤0.70, 0≤x2≤1, exhibited an even more favorable cutting performance.

REFERENCE NUMBER

1 Cutting tool
2 Substrate
3 Rake face
4 Flank face
5 Cutting edge
6 Coating layer
7 Droplets

What is claimed is:

1. A cutting tool with a rake face, a flank face, and a cutting edge at an intersecting ridge line of the rake face and the flank face comprising:
a substrate; and
a coating layer that is coated on the substrate and that is having an average composition represented by $Si_aM_{1-a}(C_{1-x}N_x)$, where M represents at least one element selected from Ti, Al, Cr, W, Mo, Ta, Hf, Nb, Zr, and Y, 0.01≤a≤0.4, and 0 ≤x≤1, the coating layer comprising a rake face portion in a region of the rake face, a flank face portion in a region of the flank face, and a cutting edge portion in a region of the cutting edge; and
wherein a Si content ratio of the rake face portion is higher than a Si content ratio of the cutting edge portion.

2. The cutting tool according to claim 1, wherein the Si content ratio of the cutting edge portion is higher than a Si content ratio of the flank face.

3. The cutting tool according to claim 1, wherein a ratio (tc/tr) of a thickness tc of the the cutting edge portion to a thickness tr of the the rake face portion is from 1.1 to 3.

4. The cutting tool according to claim 1, wherein a Si content ratio in droplets formed on the rake face is higher than an Si content ratio in droplets formed on the flank face.

5. The cutting tool according to claim 1, wherein the coating layer comprises at least a first layer and a second layer having different compositions,
wherein the first layer and the second layer are repeatedly alternately layered, with the total number of layers being at least 10.

6. The cutting tool according to claim 5, wherein one of the first layer and the second layer is composed of $Si_aTi_bAl_cNb_dW_e(C_{1-x1}N_{x1})$, where 0.01≤a≤0.80, 0.1≤b≤0.80, 0≤c≤0.80, 0≤d≤0.50, 0≤e≤0.50, a+b+c+d+e=1, and 0≤x1≤1, and the other of the first layer and the second layer is composed of $Si_gAl_hCr_i(C_{1-x2}N_{x2})$, where 0≤g≤0.30, 0.30≤h≤0.90, 0.05≤i≤0.70, 0≤x2≤1.

* * * * *